(12) United States Patent
Cho et al.

(10) Patent No.: US 9,634,674 B2
(45) Date of Patent: Apr. 25, 2017

(54) SEMICONDUCTOR DEVICE

(71) Applicants: Jong-Pil Cho, Hwaseong-si (KR);
Young-Joo Lee, Yongin-si (KR)

(72) Inventors: Jong-Pil Cho, Hwaseong-si (KR);
Young-Joo Lee, Yongin-si (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 0 days.

(21) Appl. No.: 14/837,731

(22) Filed: Aug. 27, 2015

(65) Prior Publication Data

US 2016/0105188 A1 Apr. 14, 2016

(30) Foreign Application Priority Data

Oct. 10, 2014 (KR) ........................ 10-2014-0136784

(51) Int. Cl.
| | | |
|---|---|---|
| *H03L 7/087* | (2006.01) | |
| *H04B 5/00* | (2006.01) | |
| *H03L 7/08* | (2006.01) | |
| *H03L 7/081* | (2006.01) | |
| *H03L 7/18* | (2006.01) | |
| *H03L 7/23* | (2006.01) | |
| *H04L 7/00* | (2006.01) | |

(52) U.S. Cl.
CPC ............ *H03L 7/087* (2013.01); *H03L 7/0805* (2013.01); *H03L 7/0814* (2013.01); *H03L 7/18* (2013.01); *H03L 7/23* (2013.01); *H04B 5/0025* (2013.01); *H04B 5/0031* (2013.01); *H04B 5/0056* (2013.01); *H04L 7/0008* (2013.01)

(58) Field of Classification Search
CPC . H03L 7/00; H03L 7/08; H03L 7/0802; H03L 7/0807; H03L 7/0812; H03L 7/0814; H03L 7/0816; H03L 7/0818; H03L 7/085; H03L 7/087
USPC ............. 375/354, 373, 375–376; 5/354, 373, 5/375–376
See application file for complete search history.

(56) References Cited

U.S. PATENT DOCUMENTS

| | | | | |
|---|---|---|---|---|
| 5,059,925 A | * | 10/1991 | Weisbloom ............... | H03L 7/08 331/1 A |
| 5,940,609 A | * | 8/1999 | Harrison ................... | G06F 1/06 713/503 |
| 6,275,553 B1 | * | 8/2001 | Esaki ........................ | H03L 7/23 327/147 |
| 6,636,146 B1 | | 10/2003 | Wehoski | |
| 8,779,621 B2 | | 7/2014 | Shinohara | |
| 8,922,264 B1 | * | 12/2014 | Chong ...................... | H03L 7/00 327/213 |

(Continued)

FOREIGN PATENT DOCUMENTS

| | | |
|---|---|---|
| JP | 11-045314 | 2/1999 |
| JP | 2001-175642 | 6/2001 |

(Continued)

*Primary Examiner* — Janice Tieu

(74) *Attorney, Agent, or Firm* — Volentine & Whitt, PLLC

(57) ABSTRACT

A semiconductor device including a PLL providing candidate clocks of different phases in response to a first clock received from a reader via an antenna, a phase difference detector detecting a phase difference between the first clock and a clock from the candidate clocks, a phase difference controller that selects another clock from the candidate clocks, and a driver that provides transmission data synchronously with the another clock to the reader.

9 Claims, 14 Drawing Sheets

54

(56) References Cited

U.S. PATENT DOCUMENTS

| | | | |
|---|---|---|---|
| 2006/0188051 A1* | 8/2006 | Donnelly | G06F 1/10 375/371 |
| 2009/0232197 A1 | 9/2009 | Mimura et al. | |
| 2010/0197349 A1 | 8/2010 | Morita et al. | |
| 2014/0003548 A1 | 1/2014 | Lefley | |
| 2014/0030986 A1 | 1/2014 | Caruana et al. | |

FOREIGN PATENT DOCUMENTS

| | | |
|---|---|---|
| JP | 2005-0284347 | 10/2005 |
| KR | 0516968 | 1/2004 |

\* cited by examiner

1200

1300

1400

SEMICONDUCTOR DEVICE

CROSS-REFERENCE TO RELATED APPLICATION

This application claims priority under 35 U.S.C. 119 from Korean Patent Application No. 10-2014-0136784 filed on Oct. 10, 2014, the subject matter of which is hereby incorporated by reference.

BACKGROUND

The inventive concept relates generally to semiconductor devices. More particularly, the inventive concept relates to near field communication (NFC) cards (e.g., smart cards, chip cards, integrated circuit or IC cards, etc.) capable of separately operating in a passive mode and an active mode, as well as methods of operating same.

NFC cards are configured for operation with a variety of terminal devices, hereafter referred to as "readers", although most respective readers are capable of sending data to an NFC card as well as receiving data from the NFC card. When operating in either the passive mode or active mode, it is important that data communicated by an NFC card to a reader be coherent and understandable by the reader. That is, data communicated by an NFC card to a reader must be received by the reader in a manner that allows accurate discrimination of the data.

SUMMARY

Embodiments of the inventive concept provide semiconductor devices that are capable of reliably communicating data to a reader.

According to aspects of the present inventive concept, there is provided a semiconductor device includes an antenna configured to receive a first clock from a reader, a phase locked loop (PLL) configured to receive the received first clock and output m second clocks having phase differences different from the first clock, where m is a natural number, a phase difference detector configured to receive the first clock and a third clock that is one of the m second clocks and detect a phase difference between the first clock and the third clock, a phase difference controller configured to receive the detected phase difference from the phase difference detector and select a fourth clock among the m second clocks, and a driver configured to receive the fourth clock selected by the phase difference controller and transmission data to be output to the reader and output the transmission data synchronized with the fourth clock to the reader.

According to aspects of the present inventive concept, there is provided a semiconductor device includes an antenna configured to receive a first clock from a reader, a phase locked loop (PLL) configured to receive the received first clock and output a second clock having a predetermined phase difference different from the first clock, a driver configured to receive the second clock output from the PLL and transmission data to be output to the reader and output the transmission data synchronized with the second clock to the reader, and an output controller configured to vary a magnitude of an output of the driver.

According to aspects of the present inventive concept, there is provided a semiconductor device includes an antenna configured to receive a first clock from a reader, a phase locked loop (PLL) configured to receive the received first clock and output a second clock having a predetermined phase difference different from the first clock, a driver configured to receive the second clock output from the PLL and transmission data to be output to the reader and output the transmission data synchronized with the second clock to the reader, and a duty ratio controller configured to vary a duty ratio of the transmission data provided to the driver.

According to aspects of the present inventive concept, there is provided a semiconductor device includes an antenna configured to receive a first clock from a reader, a clock generator configured to receive the first clock, and generate a second clock by allowing the first clock to bypass when a first condition is satisfied and generate a second clock having a predetermined phase difference from the first clock when a second condition is satisfied, and a driver configured to receive the second clock generated by the clock generator and transmission data to be output to the reader and output the transmission data synchronized with the second clock to the reader.

BRIEF DESCRIPTION OF THE DRAWINGS

The above, other features and associated advantages of the inventive concept will become more apparent upon consideration of certain embodiments thereof with reference to the attached drawings in which.

DETAILED DESCRIPTION

Certain embodiments of the inventive concept will be described hereafter with reference to the accompanying drawings. The inventive concept may, however, be embodied in many different forms and should not be construed as being limited to only the illustrated embodiments. Rather, these embodiments are provided so that this disclosure will be thorough and complete and will fully convey the concept of the inventive concept to those skilled in the art, and the inventive concept will only be defined by the appended claims. Throughout the drawings and written description, like reference numbers are used to denote like or similar elements.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below might thereafter be termed a second element, a second component or a second section.

Unless defined otherwise, all technical and scientific terms used herein have the same meaning as commonly understood by one of ordinary skill in the art to which this inventive concept belongs. The use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

Figure 1:
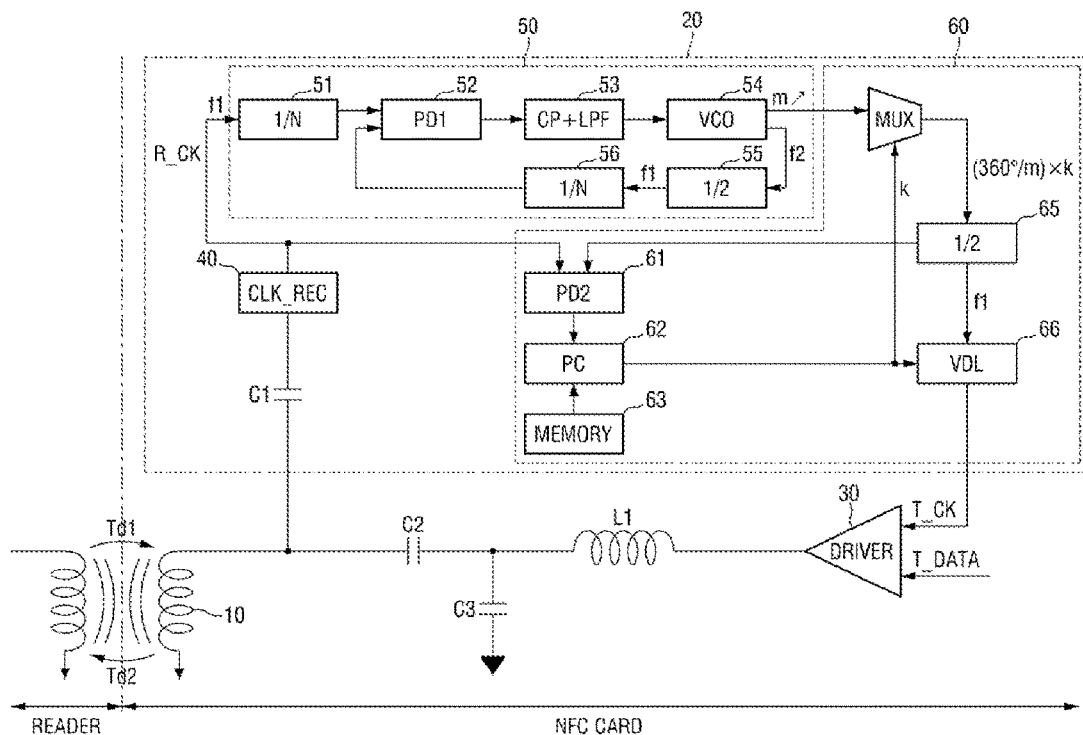
FIG. 1 is a block diagram illustrating a semiconductor device according to an embodiment of the inventive concept.
Figure 2:
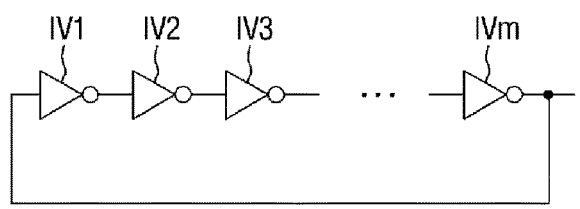
FIG. 2 is a circuit diagram further illustrating in one example the voltage controlled oscillator (VCO) 54 of FIG. 1.

Hereinafter, a semiconductor device according to an embodiment of the inventive concept will be described with reference to FIGS. 1 and 2. FIG. 1 is a block diagram illustrating the semiconductor device and FIG. 2 is a circuit diagram further illustrating in one example the voltage controlled oscillator (VCO) 54 of FIG. 1.

With reference to FIG. 1, the semiconductor device (e.g., a near field communication (NFC) card) generally comprises an antenna 10, a clock generator 20, and a driver 30.

The terms "unit" or "module" are interchangeably uses to denote a software and/or hardware component, such as a field programmable gate array (FPGA) or an application specific integrated circuit (ASIC), capable of performing certain tasks or providing certain functionality. In certain embodiments, a unit or module may be advantageously configured to reside in the addressable storage medium and/or configured for execution by one or more processors. Thus, a unit or module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided by the exemplary units or modules described hereafter may be combined into fewer components, or separated into additional components according to various designs.

The antenna 10 is configure to wirelessly communicate signal(s) between the semiconductor device and a compatible reader. In certain embodiments of the inventive concept, signals communicated between the semiconductor device and reader will be defined or configured in accordance with one or more conventionally understood near field communication (NFC) protocols. However, the scope of the inventive concept is not limited to only such embodiments.

The clock generator 20 may be used to receive a signal transmitted from the reader to the NFC card via the antenna 10, and to generate a transmission clock T_CK, where the transmission clock is subsequently used to output transmission data T_DATA. The clock generator 20 shown in FIG. 1 includes a clock receiver CLK_REC 40, a phase locking loop PLL 50, and a phase synchronizer 60.

The clock receiver 40 receives the signal transmitted from the reader (e.g.,) through the first capacitor C1, generates a reference clock R_CK based on the received signal, and provides the generated reference clock R_CK to the PLL 50. Here, the reference clock R_CK will have first frequency f1 (e.g., 13.56 MHz).

The PLL 50 of FIG. 1 includes a first frequency divider (1/N) 51, a first phase difference detector (PD1) 52, a charge pump and loop filter (CP+LPF) 53, a voltage controlled oscillator (VCO) 54, a second frequency divider (½) 55, and a third frequency divider (1/N) 56.

The first frequency divider (1/N) 51 receives the reference clock R_CK, divides down its frequency (e.g., by 1/N, where 'N' is a natural number), and provides the resulting divided frequency to the first phase difference detector 52.

The first phase difference detector 52 may be used to generate a phase difference signal by comparing the phase of a clock signal provided by the first frequency divider (1/N) 51 with a phase of a clock signal provided by the VCO 54, as provided (e.g.,) by the second and third frequency dividers (½ and 1/N) 55 and 56.

In certain embodiments of the inventive concept, the phase difference signal may include an UP detection signal and a DOWN detection signal. That is, when the phase of the clock signal provided by the second and third frequency dividers (½ and 1/N) 55 and 56 lags the phase of the clock signal provided by the first frequency divider (1/N) 51, the first phase difference detector 52 will generate an UP detection signal. In contrast, when the phase of the clock signal provided by the second and third frequency dividers (½ and 1/N) 55 and 56 leads the phase of the clock signal provided by the first frequency divider (1/N) 51, the first phase difference detector 52 will generate a DOWN detection signal.

The charge pump and loop filter (CP+LPF) 53 perform a charge pumping operation in response to the phase difference signal provided by the first phase difference detector 52 and may also be used to generate an oscillating voltage applied to the VCO 54.

Thus, when the UP detection signal is output by the first phase difference detector 52, the charge pump and loop filter (CP+LPF) 53 performs a positive charge pumping operation in response to the UP detection signal, and generates an oscillating voltage corresponding to the pumped-up electrical charge and provides the oscillating voltage to the VCO 54. Alternately, when the DOWN detection signal is provided by the first phase difference detector 52, the charge pump and loop filter (CP+LPF) 53 performs a negative charge pumping operation in response to the DOWN detection signal, and generates an oscillating voltage corresponding to pumped-down electrical charge and provides the oscillating voltage to the VCO 54.

In response to the foregoing, the VCO 54 will output m candidate clocks, where 'm' is a natural number. In this regard, the candidate clocks may be defined in certain embodiments of the inventive concept by the equation

[(360°/m)×k], where 'k' is a natural number less than or equal to m. Thus, each one of the m candidate clocks will have a respective phase derived from the reference clock R_CK, and corresponding to the oscillating voltage provided in response to the operation of the charge pump and loop filter (CP+LPF) 53.

In certain embodiments of the inventive concept, like the one shown in FIG. 2, the VCO 54 may be embodied as a ring oscillator including 'm' inverters (e.g., IV1 through IVm), however other VCO configurations may alternately be used.

Referring still to FIG. 1, the second frequency divider (½) 55 receives an output of the VCO 54 and divides down its frequency (e.g., by ½) in order to provide a divided frequency to the third frequency divider (1/N) 56. Thus, the output of the VCO 54 may be understood as having a second frequency f2 (e.g., 27.12 MHz).

The third frequency divider (1/N) 56 receives an output of the second frequency divider (½) 55 and divides down the frequency thereof (e.g., by 1/N) and thereafter provides a resulting divided frequency to the first phase difference detector 52. In some embodiments of the inventive concept, the output of the second frequency divider (½) 55 will again have the first frequency f1 (e.g., 13.56 M).

In the example illustrated in FIG. 1, the phase synchronizer 60 receives an output of the PLL 20, generates the transmission clock T_CK used to output the transmission data T_DATA based on the output of the PLL 20. Thus, the generated transmission clock T_CK may be provided to the driver 30 and used to generate (or recover) the transmission data T_DATA provided by the reader.

Here, the phase synchronizer 60 includes a multiplexer (MUX), a second phase difference detector (PD2) 61, a phase difference controller (PC) 62, a fourth frequency divider (½) 65, and a variable delay line (VDL) 66. The multiplexer (MUX) selects one of the m candidate clocks (360°/m) provided by the VCO 54 according to a control value k provided by the phase difference controller 62, where 'k' is a natural value of less than or equal to m. In certain embodiments of the inventive concept, the control value k will be set with an initial value defined by a user, and stored in the memory 63.

The second phase difference detector 61 receives the reference clock R_CK from the clock receiver 40, receives a clock selected from the m candidate clocks output from the VCO 54 according to the control value k, and detects a phase difference between these two signals. In turn, the phase difference controller 62 receives the phase difference detected by the second phase difference detector 61, and compares this value with a predetermined target phase difference in order to generate the control value k. In some embodiments of the inventive concept, the predetermined target phase difference will be 0°, for example, and the predetermined target phase difference may be stored in the memory 63. In this case, if the control value k provided to the multiplexer (MUX) is not m, the phase difference controller 62 will change the control value k to m. However, in other embodiments of the inventive concept, the predetermined target phase difference will be 180°, and in such cases, if the control value k provided to the multiplexer (MUX) is not m/2, the phase difference controller 62 will change the control value k to m/2.

As described above, the predetermined target phase difference may be set by the user or may vary according to operating circumstances. Thus, the phase difference controller 62 may compare the phase difference detected from the second phase difference detector 61 with the predetermined target phase difference and output the control value k.

In some embodiments of the inventive concept, the predetermined target phase difference may be set in consideration of a first time Td1 in which the reference clock R_CK is received from the reader, and a second time Td2 in which an output of the driver 30 is provided to the reader.

With respect to the embodiment shown in FIG. 1, the memory 63 provided in the phase synchronizer 60 may be elsewhere located or functionally substituted by another element (e.g., a register). For example, an externally disposed memory may be provided for use in relation to the phase synchronizer 60 and phase difference controller 62.

The fourth frequency divider (½) 65 receives an output of the multiplexer (MUX) and divide its frequency (e.g., by ½) to provide the same to the variable delay line 66, wherein some embodiments of the inventive concept, the output of the fourth frequency divider (½) 65 will have the first frequency f1 (e.g., 13.56 M).

The variable delay line 66 receives an output of the phase difference controller 62 and fine tuning may be performed to make the output of the fourth frequency divider (½) 65 approach to the predetermined target phase difference with respect to the reference clock R_CK.

That is, in the semiconductor device of FIG. 1, both coarse tuning and fine tuning are used to generate the transmission clock T_CK having the predetermined target phase difference with respect to the reference clock R_CK.

As described above, the coarse tuning may be performed such that the multiplexer (MUX) selects the output of the VCO 54 according to the control value k based on the output of the phase difference controller 62, and the fine tuning may be performed such that the variable delay line 66 makes the output of the fourth frequency divider (½) 65 approach to the predetermined target phase difference with respect to the reference clock R_CK by the output of the phase difference controller 62.

The resulting transmission clock T_CK is provided to the driver 30, where the driver 30 also receives the transmission data T_DATA. In this regard, the driver 30 may receive the transmission data T_DATA synchronously with the transmission clock T_CK, in order to thereby provide the synchronous transmission data to the antenna 10 via a first inductor L1 and second and third capacitors C2 and C3.

Hereinafter, operation of the semiconductor device described in relation to FIG. 1 will be described. In the following description, for the sake of convenient explanation, it is assumed that 'm' is 36, an initial value of the control value k is 1, and the predetermined target phase difference is 30°.

Under these assumptions, upon receiving a NFC signal from the reader via the antenna 10, the clock receiver 40 generates the reference clock R_CK from the received NFC signal, and supplies the reference clock R_CK to the PLL 50.

The VCO 54 of the PLL 50 then generates 36 candidate clocks (e.g., 360°/36×1) from the reference clock R_CK.

Since the initial value of k is 1, the multiplexer (MUX) outputs a clock among the 36 candidate clocks, the clock having a phase difference of 10° with respect to the reference clock R_CK.

The second phase difference detector 61 detects a phase difference of the clock having a phase difference of 10° between the reference clock R_CK and the reference clock R_CK output from the multiplexer (MUX). The detected phase difference of 10° is provided to the phase difference controller 62. The phase difference controller 62 compares the phase difference (e.g., 10°) provided from the second phase difference detector 61 with the predetermined target phase difference stored in the memory 63. But, since the predetermined target phase difference is 30°, the phase difference controller 62 changes the control value k to 3.

Here, the predetermined target phase difference stored in the memory 63 may be set in consideration of the first time Td1 in which the reference clock R_CK is received from the reader and the second time Td2 in which an output of the driver 30 is provided to the reader. In addition, the phase difference controller 62 may change the control value k to a different value to allow the transmission clock T_CK to accurately reflect the predetermined target phase difference stored in the memory 63 in consideration of the first time Td1 in which the reference clock R_CK is received from the reader and the second time Td2 in which an output of the driver 30 is provided to the reader.

That is, the first time Td1 in which the reference clock R_CK is received from the reader and the second time Td2 in which an output of the driver 30 is provided to the reader may have been taken into consideration. Alternatively, the phase difference controller 62 may subsequently change the control value k to reflect the first time Td1 and the second time Td2 later.

As described above, the multiplexer (MUX) having received a new control value k (e.g., 3) from the phase difference controller 62 will output a clock among the 36 candidate clocks provided from the VCO 54, the clock having a phase difference of 30° with respect to the reference clock R_CK.

The variable delay line 66 having received the clock having a phase difference of 30° with respect to the reference clock R_CK may perform fine tuning to make the output clock approach to the predetermined target phase difference and may output the fine tuning result as the transmission clock T_CK.

The driver 30 receives the transmission clock T_CK as well as the transmission data T_DATA, and accordingly provides transmission data T_DATA synchronized with the transmission clock T_CK to the antenna 10, such that the antenna 10 and related circuitry may supply the synchronized transmission data to the reader.

As described above, in the semiconductor device of FIG. 1, the phase synchronizer 60 generates the transmission clock T_CK having a predetermined target phase difference with respect to the reference clock R_CK, and may output the transmission data T_DATA to the reader. Therefore, the possibility of phases distortion in the signal transmitted from the NFC card to the reader will be considerably reduced, and the transmission data T_DATA will be more reliably provided to the reader during an active mode operation of the semiconductor device.

Figure 3:
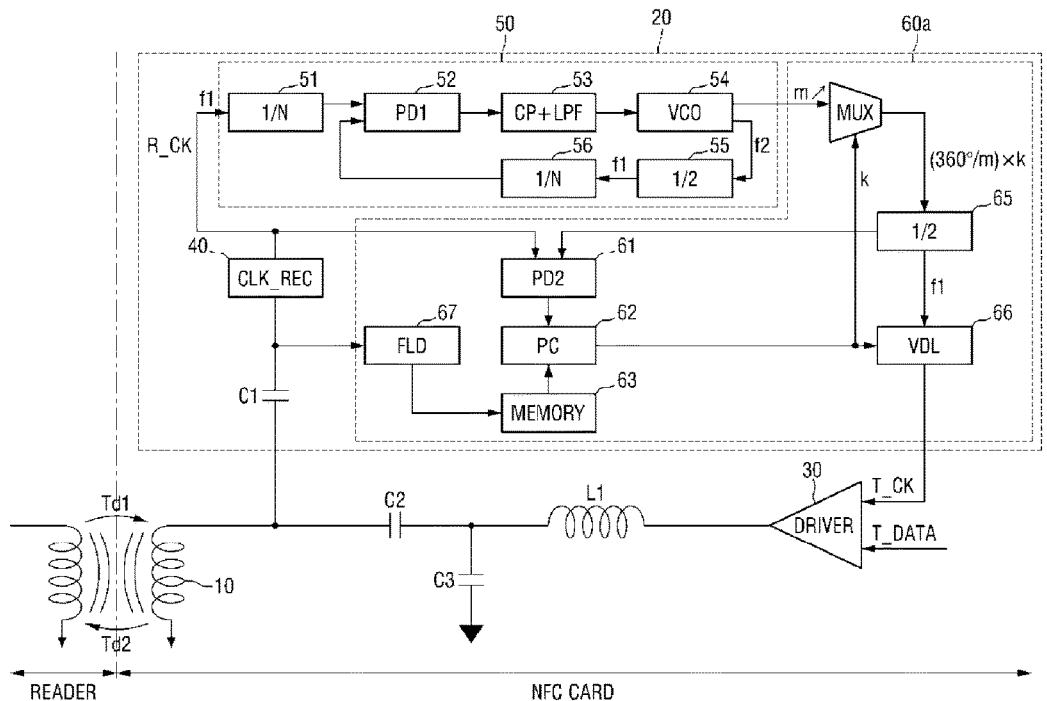
FIGS. 3, 4, 5 and 6 are respective block diagrams illustrating semiconductor devices according to various embodiments of the inventive concept.

FIG. 3 is a block diagram illustrating a semiconductor device according to another embodiment of the inventive concept. The semiconductor device of FIG. 3 is substantially similar to the semiconductor device of FIG. 1, except in the noted differences described hereafter.

Referring to FIG. 3, in the semiconductor device a phase synchronizer 60a, slightly different from phase synchronizer 60 of FIG. 1, further includes a field level detector (FLD) 67. The field level detector 67 may be used detect a level of a field generated between the reader and antenna 10, and provide detection results to the phase difference controller (PC) 62. In this manner, the phase difference controller 62 may determine the control value k provided to the multiplexer (MUX) in consideration of an output of the field level detector 67.

Thus, in certain embodiments of the inventive concept, a predetermined target phase difference stored in memory 63 may be determined in consideration of the output of the field level detector 67. That is, the field level detector 67 may be used to update the predetermined target phase difference stored in the memory 63 in consideration of the level of the field generated between the reader and antenna 10. To perform the operation, the field level detector 67 may include a processor or a separate processor (not shown) controlling this operation. Thus, the predetermined target phase difference stored in the memory 63 may be reduced as the level of the field generated between the reader and the antenna 10 increases, for example. And since the transmission clock T_CK is generated in consideration of the level of the field generated between the reader and antenna 10, the transmission data T_DATA may be more reliably provided to the reader.

Figure 4:
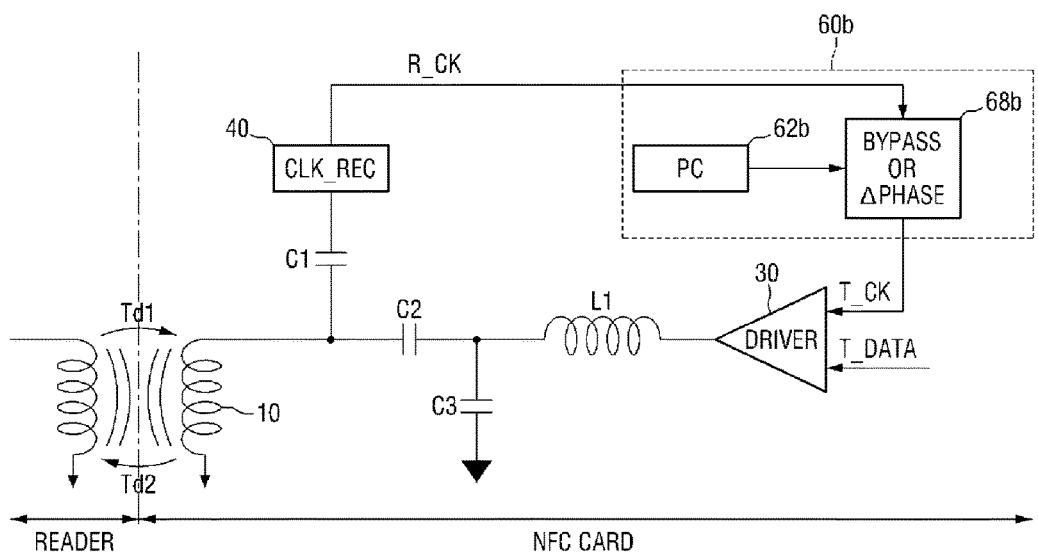

FIG. 4 is a block diagram illustrating a semiconductor device according still another embodiment of the inventive concept. As before, only material differences between the embodiments described with respect to FIGS. 1 and 2 will be discussed in relation to the embodiment of FIG. 1.

Referring to FIG. 4, in the semiconductor device (e.g., NFC card) omits the PLL 50 of FIGS. 1 and 2, and only a clock generator 60b is used to generate the transmission clock T_CK. Here, the clock generator 60b includes a generator (BYPASS OR ΔPHASE) 68b and a phase difference controller (PC) 62b.

When the reference clock R_CK provided by the clock receiver (CLK_REC) 40 satisfies a predetermined first condition, the generator 68b allows the reference clock R_CK to bypass and generates the transmission clock T_CK. When the reference clock R_CK provided by the clock receiver 40 satisfies a predetermined second condition, the generator 68b generates the transmission clock T_CK under the control of the phase difference controller 62b. Thus, when the reference clock R_CK provided by the clock receiver 40 satisfies the predetermined second condition, the phase difference controller 62b may control the generator 68b to make the transmission clock T_CK have a predetermined target phase difference with respect to the reference clock R_CK.

With this simplified configuration, a semiconductor device according to an embodiment of the inventive concept may generate the transmission clock T_CK having the predetermined target phase difference with respect to the reference clock R_CK. Therefore, the transmission data T_DATA may be more reliably provided to the reader during an active mode of the NFC card.

Figure 5:
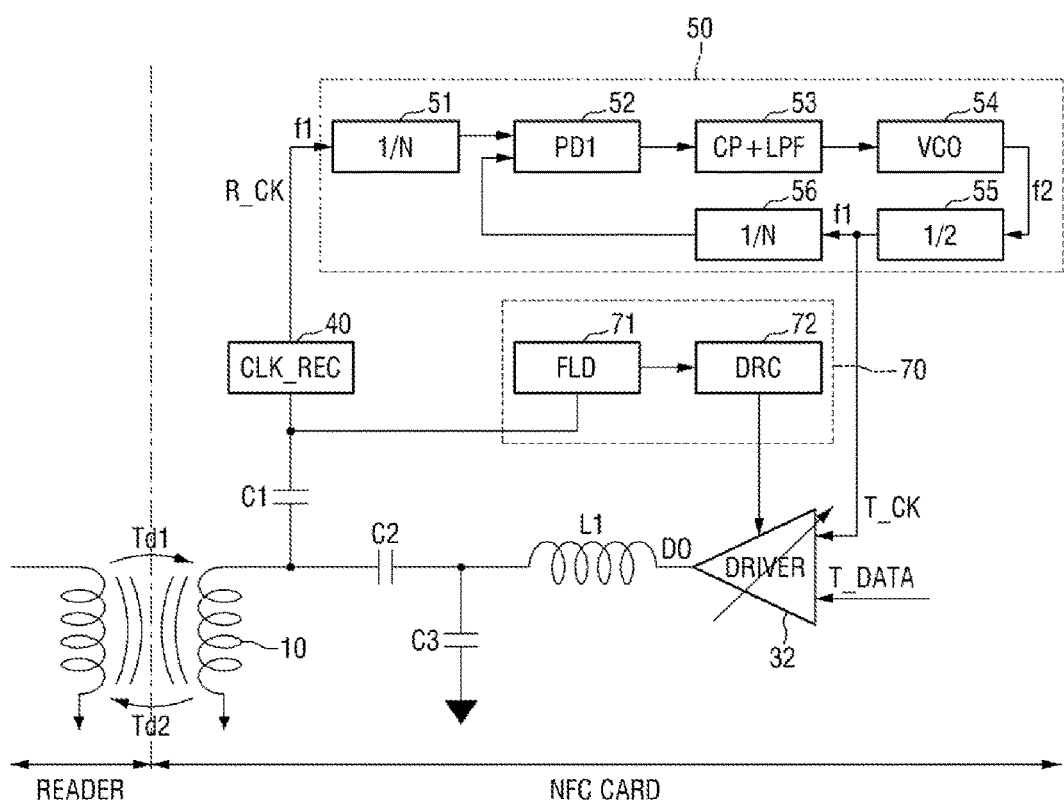

FIG. 5 is a block diagram illustrating a semiconductor device according to still another embodiment of the inventive concept.

Referring to FIGS. 1 and 5, the semiconductor device of FIG. 5 includes the PLL 50 used to generate the transmission clock T_CK synchronized with a reference clock R_CK. Again this transmission clock T_CK is provided to a driver 32. However, the semiconductor device of FIG. 5 includes an output controller 70 varying a magnitude of an output signal DO provided by the driver 32, where the output controller 70 may include a field level detector (FLD) 71 and a driver controller (DRC) 72.

The field level detector 71 may be used to detect the level of a field generated between the reader and the antenna 10, and provide a detection result to the driver controller 72. The driver controller 72 may be used to control the magnitude of the output signal DO provided by the driver 32 in consideration of an output of the field level detector 71.

That is, when the field level generated between the reader and antenna 10 is relatively low, the driver controller 72 may reduce the magnitude of the output signal DO provided by the driver 32. However, when the field level generated between the reader and antenna 10 is relatively high, the driver controller 72 may increase the magnitude of the output signal DO. Thus, since the magnitude of the output signal DO provided by the driver 32 is controlled in consideration of the level of the field generated between the reader and antenna 10, the transmission data T_DATA may be more reliably provided to the reader.

Figure 6:
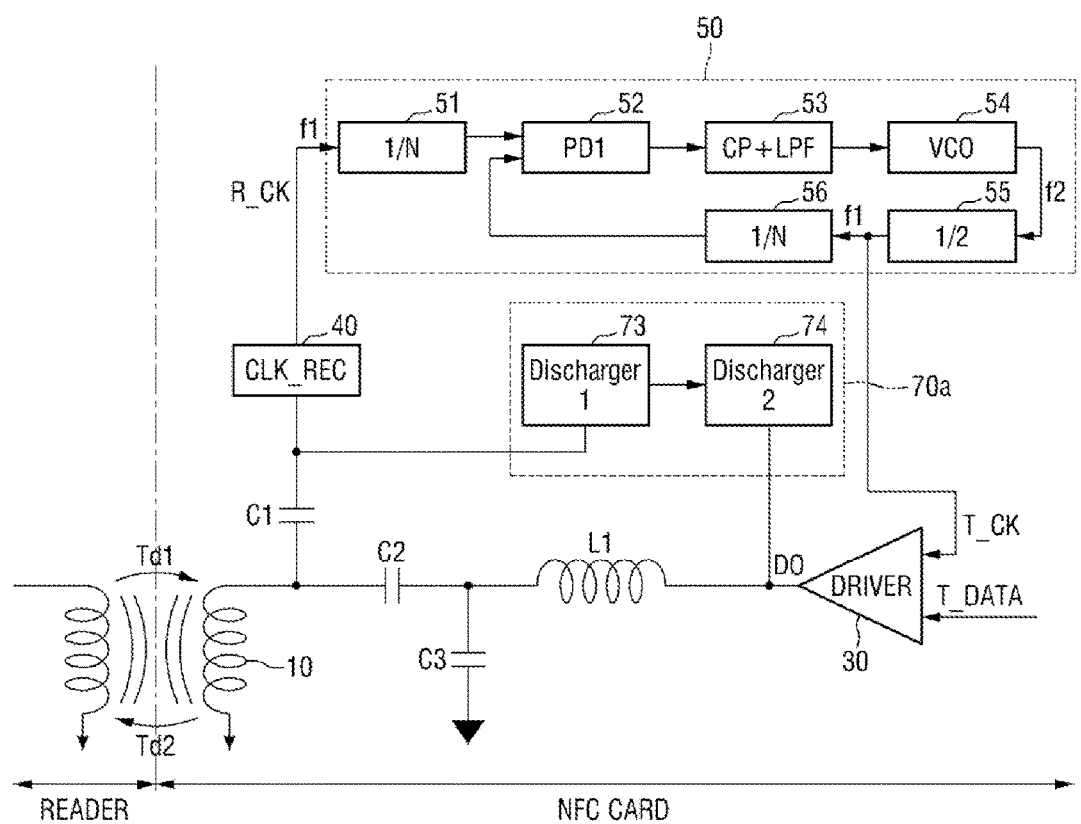

FIG. 6 is a block diagram of a semiconductor device according to still another embodiment of the inventive concept. Referring to FIG. 6, the semiconductor device includes an output controller 70a including a first discharger 73 and a second discharger 74.

The first discharger 73 may be connected to a first signal path used to communicate the reference clock R_CK provided from the antenna 10 to the PLL 50, and the second discharger 74 may be connected to a second signal path used to communicate the transmission data T_DATA synchronized with a transmission clock T_CK as provided from the driver 30 to the antenna 10. (Although the output controller 70a includes both of the first and second dischargers 73 and 74, one of the first discharger 73 and second discharger 74 may be omitted in other embodiments of the inventive concept).

Accordingly, when the transmission data T_DATA is at a low level, the first and second dischargers 73 and 74 are enabled to control a magnitude of an output signal DO provided by the driver 30.

In certain embodiments of the inventive concept, each of the first and second dischargers 73 and 74 may include a transistor gated while the transmission data T_DATA is at a low level and connecting an output port of the driver 30 to a ground port, but aspects of the present disclosure are not limited thereto.

Hereinafter, certain and various operations (or functionality) performed by the previously described semiconductor devices will be further described with reference to at least one of FIGS. 7, 8 and 9.

Figure 7:
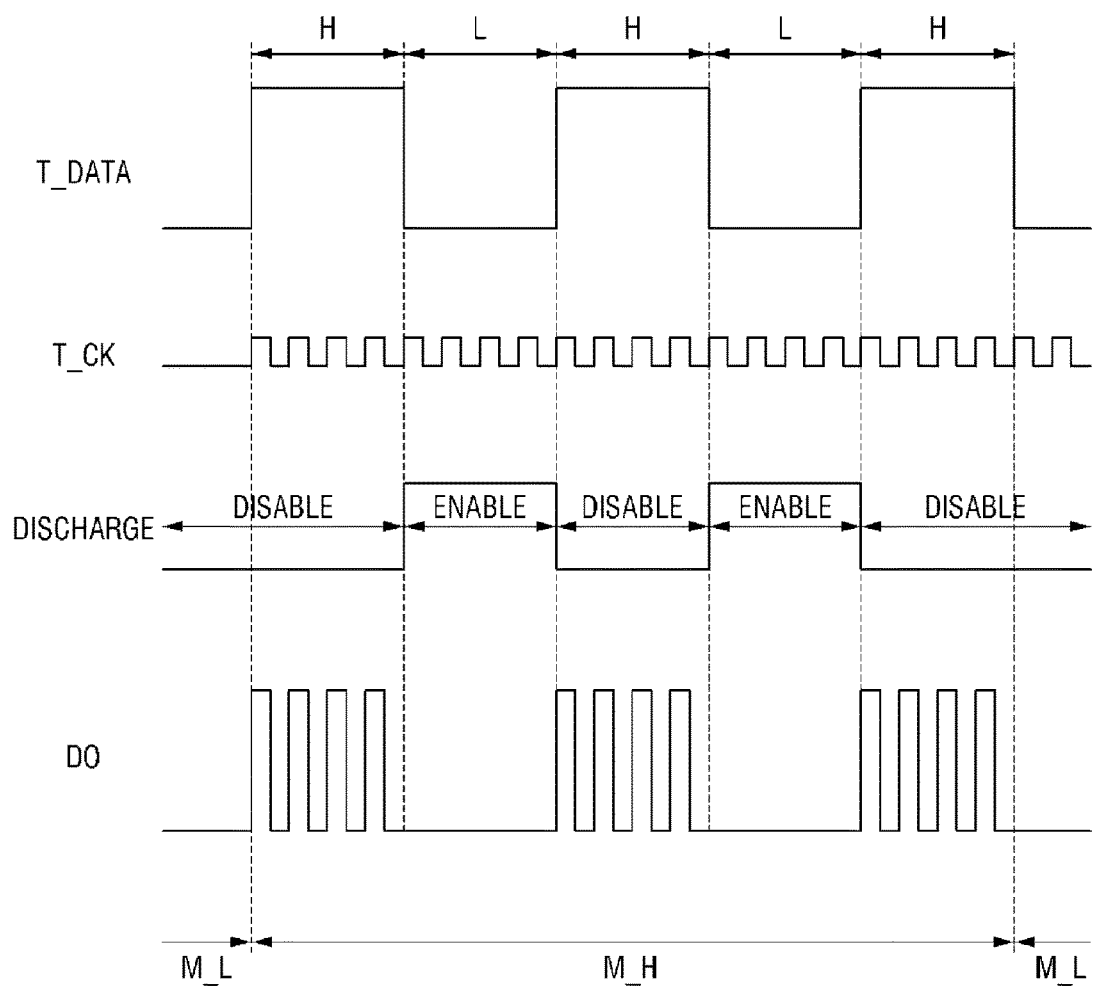
FIGS. 7, 8 and 9 are respective waveform diagrams illustrating various operations performed by the semiconductor device shown in any one of FIGS. 4, 5 and 6.

With reference to FIG. 7, the first and second dischargers 73 and 74 are disabled during a period in which the transmission data T_DATA is not provided to the driver 30 is in a modulation low period M_L.

The first and second dischargers 73 and 74 are disabled during a period in which the transmission data T_DATA is at a high level H and are enabled during a period in which the transmission data T_DATA is at a low level L while the period in which the transmission data T_DATA is supplied to the driver 30 is a modulation high period M_H.

When the first and second dischargers 73 and 74 are enabled, the output DO of the driver 30 may be discharged during a period in which the transmission data T_DATA is at the low level L while the period in which the transmission data T_DATA is supplied to the driver 30 is the modulation high period M_H. Therefore, the transmission data T_DATA can be more reliably provided to the reader.

Figure 8:
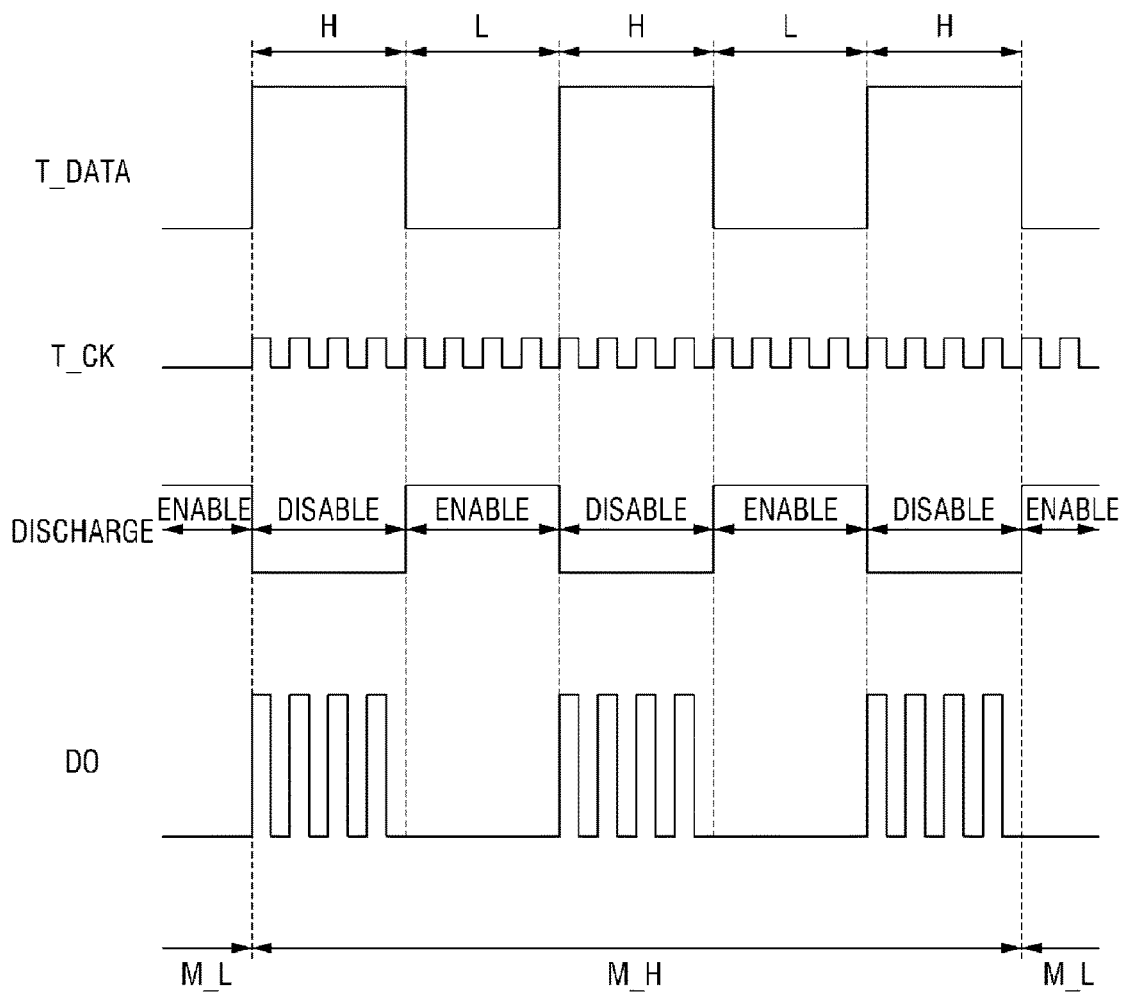

Next, referring to FIG. 8, the first and second dischargers 73 and 74 of FIG. 6 are enabled during a period in which the transmission data T_DATA is not supplied to the driver 30 is a modulation low period M_L.

In addition, the first and second dischargers 73 and 74 are disabled during a period in which the transmission data T_DATA is at the high level L and are enabled during a period in which the transmission data T_DATA is at the low level L, while the period in which the transmission data T_DATA is supplied to the driver 30 is the modulation high period M_H.

When the first and second dischargers 73 and 74 are enabled, the output DO of the driver 30 may be discharged during a period in which the transmission data T_DATA is at the low level L while the period in which the transmission data T_DATA is not supplied to the driver 30 is the modulation low period M_L and the period in which the transmission data T_DATA is supplied to the driver 30 is the modulation high period M_H.

Therefore, since the magnitude of the transmission data T_DATA provided from the NFC card to the reader is increased, the transmission data T_DATA can be more reliably provided to the reader during an active mode.

Figure 9:
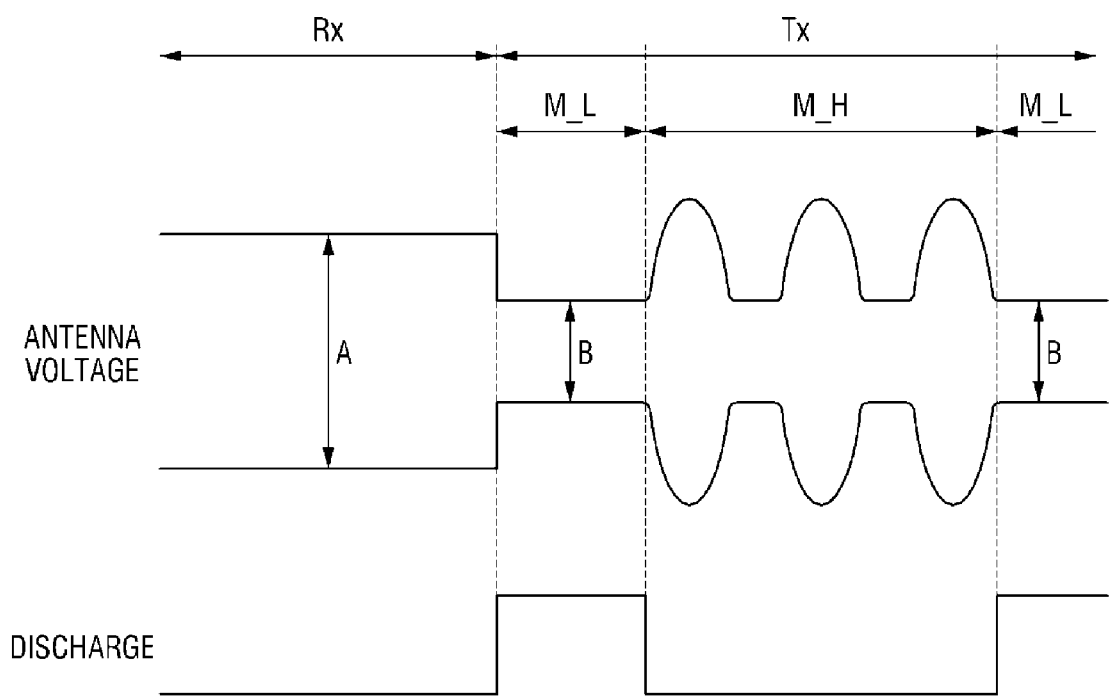

Next, referring to FIG. 9, the first and second dischargers 73 and 74 of FIG. 6 may be disabled during a reception period Rx in which a signal synchronized with a reference clock R_CK is received from the reader, and may be enabled during part of a transmission period Tx in which the signal is output from an NFC card to the reader.

That is, during the transmission period Tx, the first and second dischargers 73 and 74 may be enabled in the modulation low period M_L in which the transmission data T_DATA is not supplied to the driver 30 and may be disabled in the modulation high period M_H in which the transmission data T_DATA is supplied to the driver 30.

As the result of the operation, an antenna voltage may be at a level A during the reception period Rx, and may be at a level B less than the level A in the modulation low period M_L during transmission period Tx.

Hence, since magnitudes of the signal supplied from the reader and the transmission data T_DATA supplied from the NFC card to the reader vary, the transmission data T_DATA can be reliably provided to the reader in an active mode.

Figure 10:
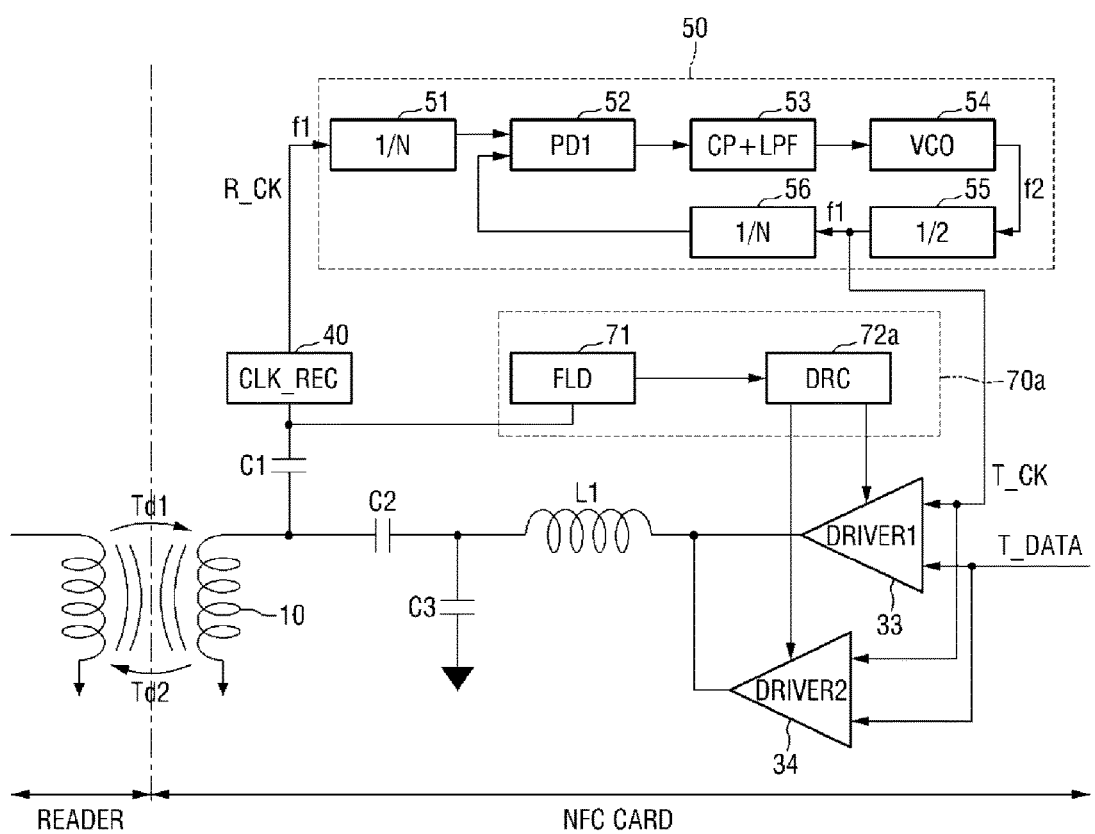
FIGS. 10 and 11 are respective block diagrams illustrating semiconductor devices according to additional embodiments of the inventive concept.

FIG. 10 is a block diagram illustrating a semiconductor device according to still another embodiment of the inventive concept.

Referring to FIGS. 1, 5 and 10, the semiconductor device replaces the driver 30 with a first driver 33 and a second driver 34.

The output controller 70a again includes the field level detector 71 detecting a field generated between the reader and antenna 10, and driver controller 72a determining whether first and second drivers 33 and 34 are enabled or not in consideration of an output of the field level detector 71.

Here, the first driver 33 and second driver 34 may have the same magnitude. In this case, when the field generated between the reader and the antenna 10 is at a high level, the driver controller 72a may enable both of the first driver 33 and the second driver 34.

When the field generated between the reader and antenna 10 is at a low level, the driver controller 72a may enable the first driver 33 and disable the second driver 34. Alternatively, the driver controller 72a may disable the first driver 33 and enable the second driver 34.

Accordingly, when the field generated between the reader and antenna 10 is at a high level, the transmission data T_DATA having a large magnitude is output from the NFC card to the reader and the field generated between the reader and the antenna 10 is at a low level, the transmission data T_DATA having a small magnitude may be output from the NFC card to the reader.

Alternately, the first driver 33 and second driver 34 may have different magnitudes. For example, the magnitude of the second driver 34 may be larger than that of the first driver 33. In this case, when the field generated between the reader and the antenna 10 is at a high level, the driver controller 72a may disable the first driver 33 and enable the second driver 34, and when the field generated between the reader and antenna 10 is at a low level, the driver controller 72a may enable the first driver 33 and disable the second driver 34.

Accordingly, when the field generated between the reader and the antenna 10 is at a high level, the transmission data T_DATA having a large magnitude is output from an NFC card to a reader, and the field generated between the reader and the antenna 10 is at a low level, the transmission data T_DATA having a smaller magnitude may be output from the NFC card to the reader.

Figure 11:
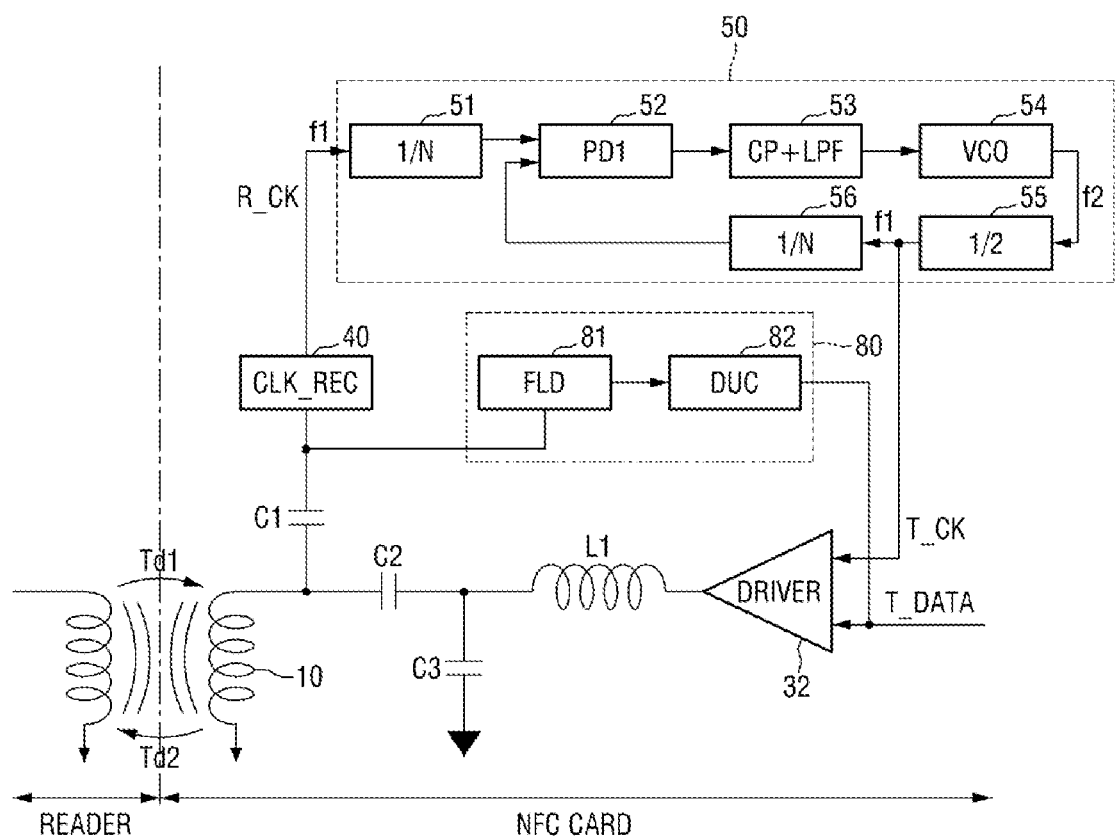

FIG. 11 is a block diagram illustrating a semiconductor device according to still another embodiment of the inventive concept. Here, the semiconductor device of FIG. 11 includes a duty ratio controller 80 varying a duty ratio of transmission data T_DATA supplied to a driver 32.

The duty ratio controller 80 includes a field level detector 81 detecting a level of a field generated between the reader and antenna 10, and a controller 82 controlling the duty ratio of the transmission data T_DATA in consideration of an output of the field level detector 81.

Operation of the semiconductor device illustrated in FIG. 11 will be further described with reference to FIG. 12.

Figure 12:
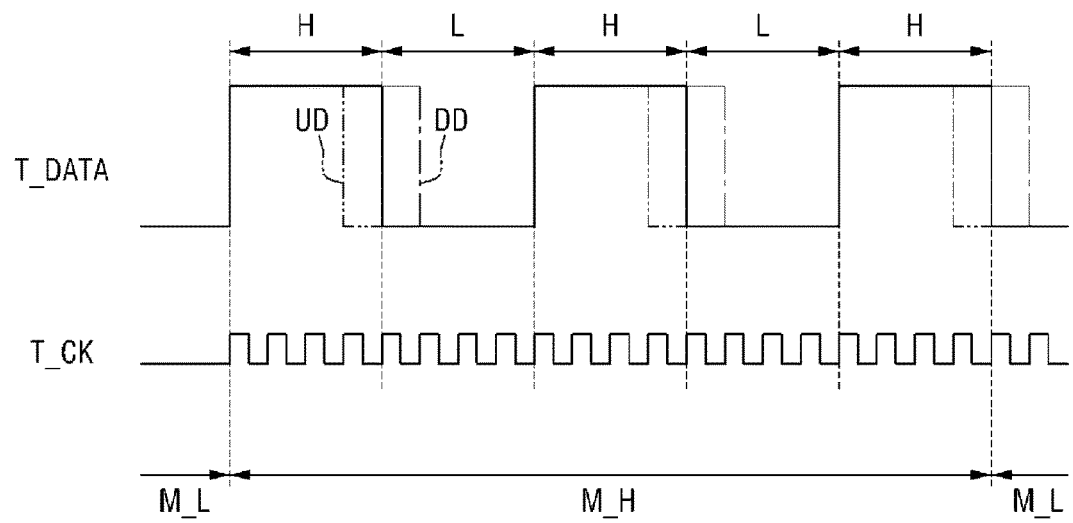
FIG. 12 is a waveform diagram illustrating various operations performed by the semiconductor device of FIG. 11.

Thus, referring to FIGS. 11 and 12, the controller 82 may be used to reduce a duty of transmission data T_DATA during a period in which the transmission data T_DATA is at a high level H, and increase a duty of the transmission data T_DATA during a period in which the transmission data T_DATA is at a low level L (UD). Alternately, the controller 82 may increase the duty of transmission data T_DATA during the period in which the transmission data T_DATA is at a high level H, and reduce the duty of the transmission data T_DATA during the period in which the transmission data T_DATA is at a low level L (DD). In this regard, since the duty of the transmission data T_DATA varies according to the level of the field between the NFC card and the reader, the NFC card may more reliably provide the transmission data T_DATA to the reader.

Figure 13:
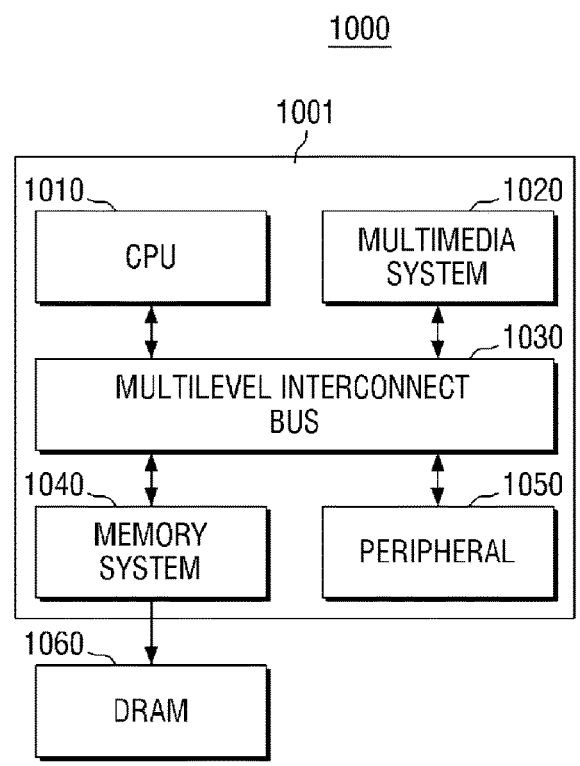
FIG. 13 is a block diagram illustrating a System-On-Chip (SoC) that may incorporate a semiconductor device according to an embodiment of the inventive concept.

FIG. 13 is a block diagram of a System-on-Chip (SoC) that may incorporate a semiconductor device according to an embodiment of the inventive concept.

Referring to FIG. 13, the SoC 1000 generally includes an application processor (AP) 1001 and a DRAM 1060.

The AP 1001 may include a central processing unit (CPU) 1010, a multimedia system 1020, a multilevel interconnect bus 1030, a memory system 1040, and a peripheral circuit 1050.

The CPU 1010 may perform operations necessary for operating the SoC 1000. In some embodiments of the present inventive concept, the CPU 1010 may be configured in a multi-core environment including a plurality of cores.

The multimedia system 1020 may be used in performing a variety of multimedia functions in the SoC 1000. The multimedia system 1020 includes a 3D engine module, a video codec, a display system, a camera system, and a post-processor.

The bus 1030 may be used in performing data communication among the CPU 1010, the multimedia system 1020, the memory system 1040, and the peripheral circuit 1050. The bus 1030 may have a multi-layered structure, and may include a multi-layer advanced high-performance bus (AHB), or a multi-layer advanced eXtensible interface (AXI), but the scope of the illustrated embodiment in not limited thereto.

The memory system 1040 provide environments necessary for high-speed operation by connecting the AP 1001 to an external memory (e.g., the DRAM 1060). Thus, the memory system 1040 may include a separate controller (e.g., a DRAM controller) for controlling the external memory.

The peripheral circuit 1050 may provide environments necessary for smoothly connecting the SoC 1000 to an external device (e.g., a main board). Accordingly, the peripheral circuit 1050 may include various kinds of interfaces enabling the external device connected to the SoC system 1000 to be compatibly used.

The DRAM 1060 may function as a working memory required to operate the AP 1001. Tus, the DRAM 1060 may be disposed external to the AP 1001. The DRAM 1060 may be packaged with the AP 1001 in the form of a package on package (PoP).

At least one of components of the SoC 1000 may incorporate a semiconductor device according to an embodiment of the inventive concept.

Figure 14:
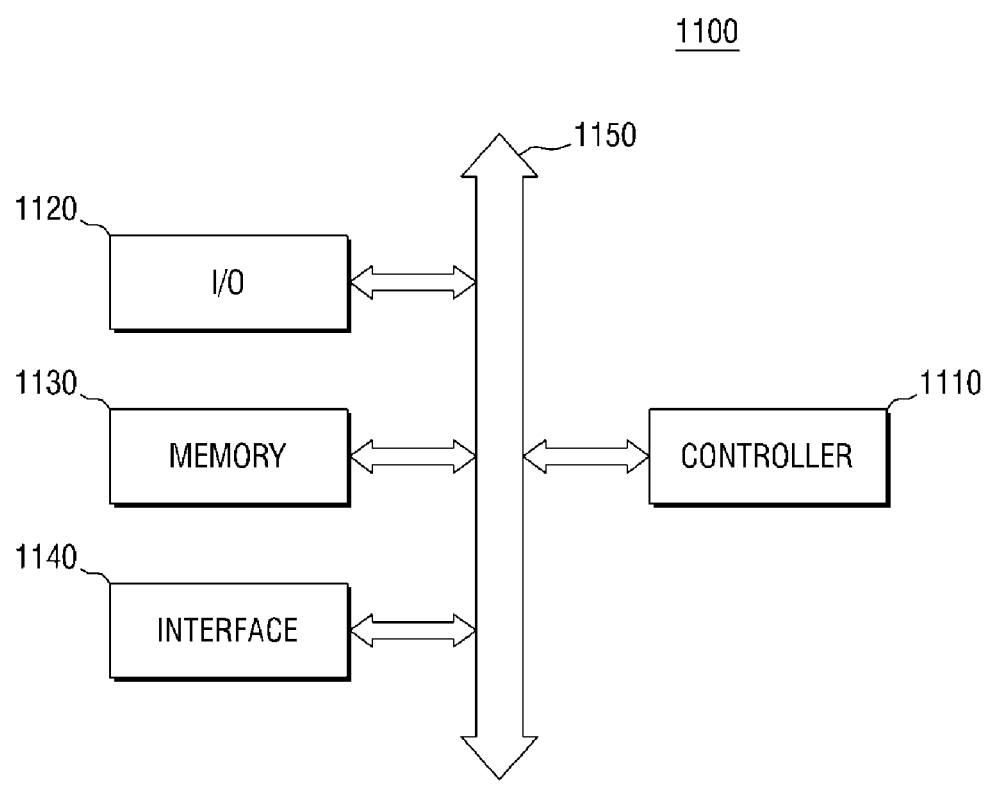
FIG. 14 is a block diagram illustrating an electronic system that may incorporate a semiconductor devices according to an embodiment of the inventive concept.

FIG. 14 is a block diagram of an electronic system that may incorporate a semiconductor device according to an embodiment of the inventive concept.

Referring to FIG. 14, the electronic system 1100 may include a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a key pad, a key board, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on.

Although not shown, the electronic system 1100 may further include high-speed DRAM and/or SRAM as the working memory for improving the operation of the controller 1110.

At least one of the semiconductor device according to an embodiment of the inventive concept may be incorporated as a component within the electronic system 1100.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 15:
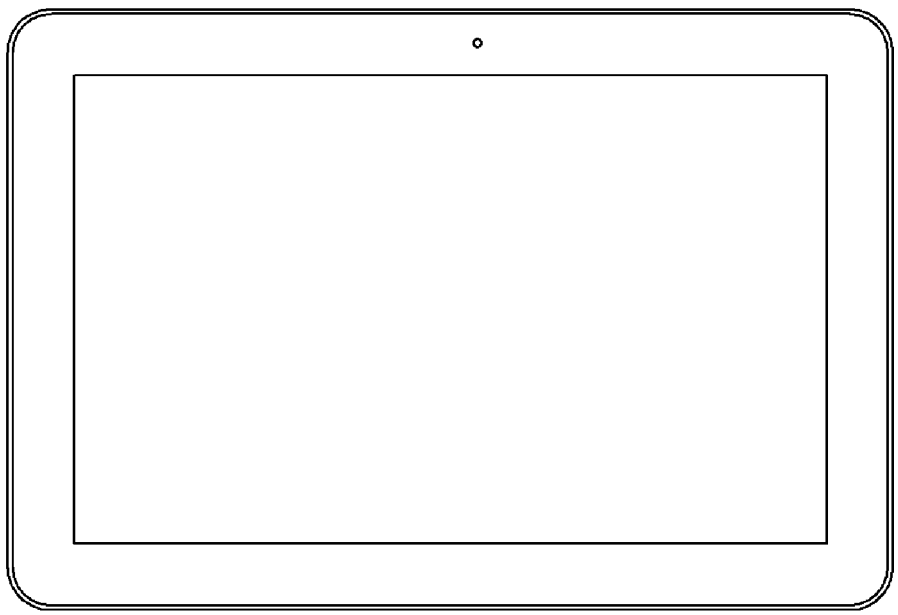
FIGS. 15, 16 and 17 respectively illustrate electronic devices that may incorporate a semiconductor system or semiconductor devices according to an embodiment of the inventive concept.
Figure 16:
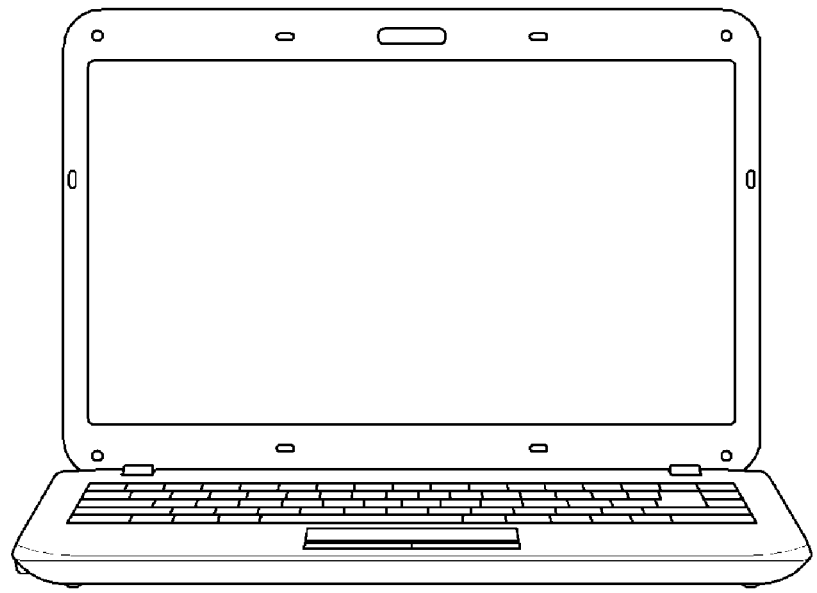
Figure 17:
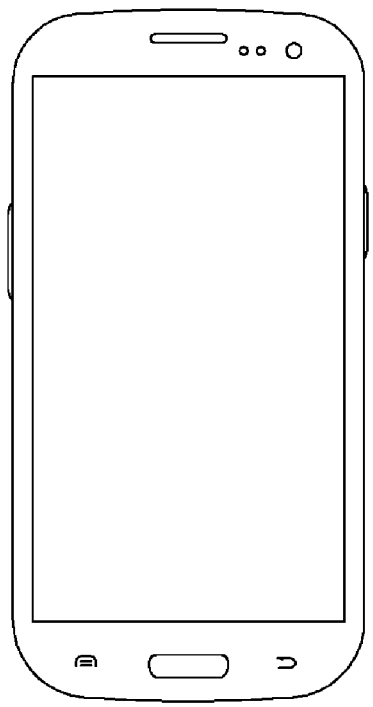

FIGS. 15, 16 and 17 illustrate various systems which may incorporate a semiconductor device according to an embodiment of the inventive concept.

FIG. 15 illustrates an example in which a semiconductor device according to an embodiment of the inventive concept is applied to a tablet PC (1200). FIG. 16 illustrates an example in which a semiconductor device according to an embodiment of the inventive concept is applied to a notebook computer (1300), and FIG. 17 illustrates an example in which a semiconductor device according to an embodiment of the inventive concept is applied to a smart phone (1400).

In addition, it will be apparent to those skilled in the art that the semiconductor devices according to embodiments of the inventive concept may also be applied to other electronic system not illustrated herein, such as a general purpose computer, an ultra-mobile personal computer (UMPC), a work station, a net-book, a personal digital assistant (PDA), a portable computer, a wireless phone, a mobile phone, a smart phone, an e-book, a portable multimedia player (PMP), a potable game console, a navigation device, a black box, a digital camera, a 3-dimensional (3D) television, a digital audio recorder, a digital audio player, a digital picture recorder, a digital picture player, a digital video recorder, or a digital video player.

While the present inventive concept has been particularly shown and described with reference to exemplary embodiments thereof, it will be understood by those of ordinary skill in the art that various changes in form and details may be made therein without departing from the scope of the following claims.

What is claimed is:

1. A semiconductor device comprising:
   a phase locked loop (PLL) that receives a reference clock and derives candidate clocks from the reference clock, wherein each one of the candidate clocks has a different phase;
   a multiplexer that receives the candidate clocks and selects a first selected clock from among the candidate clocks in response to a first control value and selects a second selected clock from among the candidate clocks, different from the first selected clock, in response to a second control value;
   a phase difference detector that detects a phase difference between the reference clock and the first selected clock;
   a phase difference controller generates the second control value in response to the detected phase difference;
   a variable delay line that generates a transmission clock in response to the second selected clock; and
   a driver that provides transmission data synchronously with the transmission clock.

2. The semiconductor device of claim 1, wherein the PLL comprises a voltage controlled oscillator (VCO) that provides the candidate clocks.

3. The semiconductor device of claim 1, further comprising:
   a memory that stores a predetermined phase difference, wherein the second selected clock is a clock among the candidate clocks having a phase difference relative to the reference clock that is closest to the predetermined phase difference.

4. The semiconductor device of claim 3, wherein the phase difference controller determines the second control value in response to a first time period during which the reference clock is initially received and a second time period during which the driver initially provides the transmission data.

5. The semiconductor device of claim 1, wherein the semiconductor device is configured as a near field communication (NFC) card and further comprises an antenna.

6. The semiconductor device of claim 5, further comprising:
   a field level detector that detects a level of a field generated between an externally disposed reader and the antenna, wherein the phase difference controller generates the second control value in response to an output of the field level detector.

7. A near field communication (NFC) card comprising:
   an antenna;
   a clock generator that generates a transmission clock; and
   a driver that provides transmission data to the antenna synchronously with the transmission clock,
   wherein the clock generator comprises:
      a phase locked loop (PLL) that derives candidate clocks from a reference clock, wherein each one of the candidate clocks has a different phase respectively defined by m divisions of the reference clock, where 'm' is a natural number;
      a multiplexer that receives the candidate clocks and selects a first selected clock from among the candidate clocks in response to a first control value and selects a second selected clock from among the candidate clocks in response to a second control value;
      a phase difference detector that detects a phase difference between the reference clock and the first selected clock;
      a phase difference controller generates the second control value in response to the detected phase difference; and
      a variable delay line that generates the transmission clock in response to the second selected clock.

8. The NFC card of claim 7, wherein the clock generator further comprises a clock receiver that generates the reference clock in response to a signal received from an externally disposed reader.

9. The NFC card of claim 8, further comprising:
   a field level detector that detects a level of a field generated between the externally disposed reader and the antenna, wherein the phase difference controller generates the second control value in response to an output of the field level detector.

* * * * *